United States Patent
Sloan et al.

(10) Patent No.: US 6,308,776 B1
(45) Date of Patent: *Oct. 30, 2001

(54) TEMPERATURE CONTROL APPARATUS WITH RECIRCULATED COOLANT

(75) Inventors: Ben J. Sloan, Garland; William G. Reed, Richardson, both of TX (US)

(73) Assignee: FSI International, Inc., Chaska, MN (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/100,338

(22) Filed: Jan. 7, 1998

Related U.S. Application Data

(63) Continuation of application No. 08/184,681, filed on Jan. 21, 1994, now abandoned.

(51) Int. Cl.[7] .................................................. F25B 29/00
(52) U.S. Cl. ........................... 165/206; 165/264; 165/61; 165/64; 165/290; 165/80.4
(58) Field of Search .................. 165/30, 34, 104.33, 165/61, 64, 80.4, 263, 264, 206, 290

(56) References Cited

U.S. PATENT DOCUMENTS

| | | |
|---|---|---|
| 3,227,207 | 1/1966 | Litman . |
| 3,229,754 | 1/1966 | Hoag . |
| 3,236,292 | 2/1966 | Smith, Jr. . |
| 3,360,032 | 12/1967 | Sherwood . |
| 3,370,454 | 2/1968 | Flores . |
| 3,612,165 | 10/1971 | Haynes . |
| 3,645,697 | 2/1972 | Hoffman, Jr. . |
| 4,072,181 | 2/1978 | Kostura et al. . |
| 4,621,678 | 11/1986 | Hahn et al. . |
| 4,651,813 | 3/1987 | Witt et al. . |
| 4,729,424 | 3/1988 | Mizuno et al. . |
| 4,784,213 | * 11/1988 | Eager et al. .......................... 165/298 |
| 4,789,025 | 12/1988 | Brandemuehl et al. . |
| 4,956,043 | 9/1990 | Kanetomo et al. . |
| 4,984,628 | 1/1991 | Uchida et al. . |
| 5,084,671 | 1/1992 | Miyata et al. . |
| 5,226,472 | 7/1993 | Benevelli et al. . |
| 5,348,076 | 9/1994 | Asakawa . |
| 5,577,552 | * 11/1996 | Ebinuma et al. ..................... 165/101 |
| 5,706,890 | * 1/1998 | Sloan et al. .......................... 165/206 |

FOREIGN PATENT DOCUMENTS

| | | |
|---|---|---|
| 967751 | 12/1957 | (DE) . |
| 3412157 | 10/1985 | (DE) . |

(List continued on next page.)

*Primary Examiner*—John K. Ford
(74) *Attorney, Agent, or Firm*—Kagan Binder, PLLC

(57) ABSTRACT

A temperature control and process for adjusting the temperature of a workstation and a work medium at a workstation to a predetermined temperature. The temperature control comprises a cooling vehicle such as a heat exchanger, a coolant temperature sensor and control, a source of fluid coolant such as a manifold, a recirculating pump, a flow line to circulate the coolant to the workstation with the flow line containing a flow regulator and a heater, a bypass valve for bypassing the flow regulator and heater, and a workstation temperature sensor and control. The workstation temperature control controls the operation of the heater and bypass valve so that the temperature of the coolant is below the desired temperature for the workstation, thus achieving a rapid transient response while avoiding overcooling. The coolant temperature control and workstation temperature control may be in a temperature control computer, thus providing a large number of different operating sequences. A number of embodiments of workstations are also described.

10 Claims, 4 Drawing Sheets

FOREIGN PATENT DOCUMENTS

| | | |
|---|---|---|
| 0 003 822 | 2/1979 | (EP) . |
| 0411916A3 | 7/1990 | (EP) . |
| 60-167745 | 8/1985 | (JP) . |
| 63-283842 | 11/1988 | (JP) . |
| 2-38805 | 9/1990 | (JP) . |
| 3-62920 | 3/1991 | (JP) . |
| 3-35060 | 5/1991 | (JP) . |
| 5-143169 | 6/1993 | (JP) . |
| 5-253790 | 10/1993 | (JP) . |

* cited by examiner

TEMPERATURE CONTROL APPARATUS WITH RECIRCULATED COOLANT

This application is a continuation of application Ser. No. 08/184,681 filed on Jan. 21, 1994 now abandoned.

This invention relates to a temperature control apparatus and method with recirculated coolant for rapidly cooling a workstation with a work medium or workpiece to a set temperature.

BACKGROUND OF THE INVENTION

Applications such as photoresist processing on semiconductor wafers require very precise temperature control of chemicals and silicon wafers. To achieve such precise control of temperatures, temperature controls with recirculated coolant are used.

Most temperature controls of this type use a recirculated coolant, such as water, for temperature control at or around room temperature. Most such temperature controls require large flow rates in order to achieve rapid transient response, since the coolant is set at the temperature to be achieved in the material being controlled and heat transfer near the set point is very slow. Most such temperature controls also require multiple circulators to achieve temperature control of multiple workstations at different temperatures.

SUMMARY OF THE INVENTION

An object of the invention is to provide a temperature control with rapid transient response with minimal flow rates.

A second object of the invention is to provide a temperature control which uses only one circulator to achieve control of temperature of multiple workstations.

A feature of the invention is the apparatus for producing cooling at a workstation sufficient to rapidly bring the workstation and a solid or fluid work medium therein to a predetermined temperature, i.e., for achieving a rapid transient response, i.e., the time required to cool the workstation from its initial temperature to a temperature closely approaching that desired. Such rapid cooling is achieved by introducing into the workstation a coolant at a lower temperature than the predetermined temperature, and by adding heat to the coolant in its flow line as the temperature in the workstation nearly simulates the desired predetermined temperature.

Another feature of the invention is the apparatus for adjusting the temperature of a workstation, thus providing the ability to set the workstation temperature below, at, or above the ambient temperature.

Another feature of the invention is the apparatus for circulating coolant to multiple workstations with only one circulator. Having only one circulator for multiple workstations increases reliability and reduces cost versus multiple circulator approaches.

Another feature of the invention is the apparatus for adjusting the temperature of multiple workstations. In this way, each workstation may have a separate set point temperature below, at, or above its ambient temperature.

Still another feature of the invention is the method of providing control of temperature to multiple workstations, wherein rapid transient response is achieved by momentarily introducing a flow of unwarmed coolant to the workstations, wherein only one circulator is used, and wherein the coolant temperature is slightly below the temperature of the workstations, the coolant being precisely warmed at each workstation.

DETAILED SPECIFICATION OF THE PREFERRED EMBODIMENTS

Figure 1:
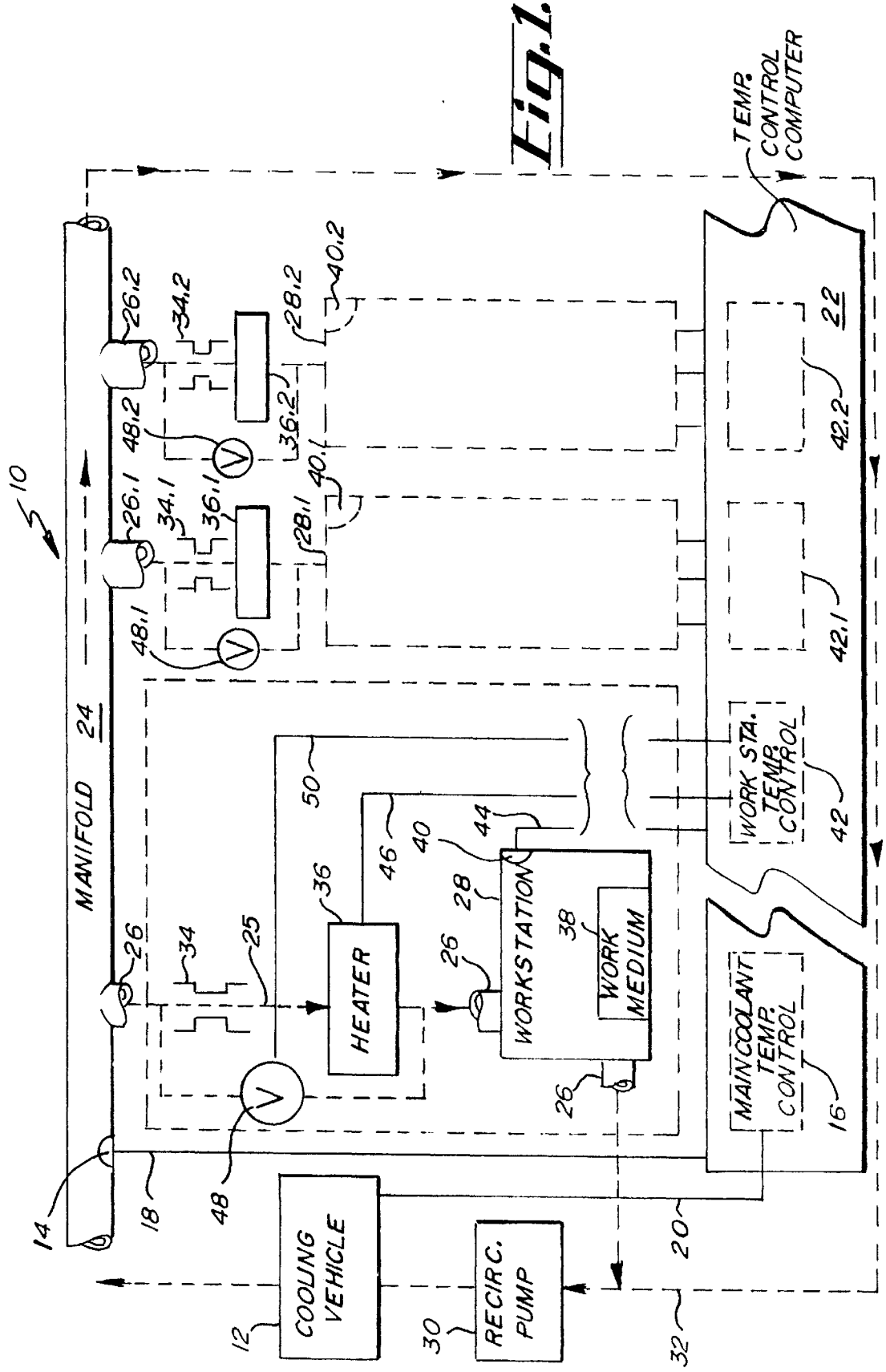
FIG. 1 is a diagrammatic sketch of the temperature control apparatus.

An embodiment of the invention is indicated in FIG. 1 by the numeral 10. The invention comprises first a source of fluid coolant and a means for maintaining the fluid coolant at a temperature below a predetermined temperature at or around room temperature. The invention maintains the fluid coolant temperature within a tolerance of ±0.5° C.

The means for maintaining the fluid coolant below a predetermined temperature comprises a cooling vehicle and associated controls. A cooling vehicle 12, such as a heat exchanger, cools the fluid coolant to a temperature below that desired for the workstation and work medium or workpiece. A main coolant temperature sensor 14 detects the temperature of the fluid coolant. Upon detecting the temperature of the fluid coolant, the temperature sensor 14 provides an indication of this temperature to a main coolant temperature control 16 by means of a sensor lead 18, such as a wire or other means of transmission. Acting upon set point information provided by the operator, the main coolant temperature control 16 signals the cooling vehicle 12, by means of a control lead 20, which may be a wire or other transmission medium, to remove enough heat from the fluid coolant to establish and maintain the temperature of the fluid coolant at the desired temperature, which is below that desired for the workstation and work medium or workpiece. The main coolant temperature control 16 may be in a programmed temperature control computer 22.

Coolant from the cooling vehicle 12 enters a source of fluid coolant, such as a pipe or manifold 24. In this embodiment of the invention, the temperature sensor 14 described above is within or attached to the manifold 24, thus sensing the temperature of the fluid coolant at the manifold 24.

Coolant from the cooling vehicle 12 and manifold 24 is circulated to and through the workstation 28 by coolant circulating means comprising a flow line 26, return line 32 and a recirculating pump 30.

Fluid coolant 25 from the manifold 24 enters the flow line 26. The flow line 26 preferably contains a flow regulator 34 which maintains the desired rate of flow of liquid coolant through the flow line 26. A specific embodiment of such a flow regulator is a fixed orifice. The flow line 26 also contains a heater 36 such as an electrical resistance heater for regulating the temperature of the fluid coolant flowing to the workstation 28, and continuously adding heat when called for, to the continuously flowing coolant fluid.

Fluid coolant enters the workstation 28 from the flow line 26, passes through the workstation 28, and exits the workstation 28 into the flow line 26. Coolant then returns to the recirculating pump 30 and cooling vehicle 12 by return line 32. Coolant from the manifold 24 also directly returns to the recirculating pump 30 and cooling vehicle through return line 32.

As the fluid coolant passes through the workstation 28, the fluid coolant adjusts the temperature of the workstation 28 to the temperature of the fluid coolant by heat transfer. Although the coolant in the flow line 26 is normally cooler than the workstation 28, coolant in the flow line 26 may also be at a higher temperature than that of the workstation 28. The workstation 28 is closely associated with a work medium or workpiece 38 whose temperature is to be controlled, the temperature of the work medium or workpiece thus approximating that of the workstation.

The workstation 28 has associated with it a workstation temperature sensor 40, in such a manner that the temperature sensor 40 detects the temperature of the workstation 28. Upon detecting the temperature of the workstation 28, the temperature sensor 40 provides an indication of this temperature to a control means, workstation temperature control 42 by means of a sensor lead 44, such as a wire or other transmission medium. The set point temperature to be maintained at the workstation 28 is provided to the workstation temperature control 42 by the operator. The workstation temperature control 42 may be in a programmed temperature control computer, thus providing a great deal of flexibility and precision in regulating the temperature of the workstation. The workstation temperature control 42 compares the temperature indication from the workstation temperature sensor 40 to the desired temperature, and takes appropriate action to adjust the workstation temperature to the desired temperature.

To adjust the workstation temperature to the desired temperature, the workstation temperature control 42 signals the heater 36 to provide more or less heat by means of a control lead 46, which may be a wire or other transmission medium. The heater heats only that portion of the coolant flowing in flow line 26 to the workstation 28, rather than the entire source of coolant. This provides for precise and rapid control of the temperature of the workstation.

The flow line also contains a means, such as a valve 48, for bypassing both the flow regulator 34 and the heater 36. When the bypass valve 48 is opened, it will be seen that a flow of unwarmed coolant will be supplied to the workstation 28 at an increased rate of flow, thus rapidly cooling the workstation 28. The valve 48 is controlled by the workstation temperature control 42 by means of a control lead 50, which may be a wire or other transmission medium.

It will be appreciated by those skilled in the art that the sequence in which the bypass valve 48 and heater 36 are operated will depend upon the rapidity of the transient response required, and the initial temperature differential between the temperature of the workstation 42 and the desired temperature. At one extreme, an initial large temperature differential such as 5° C. might cause the workstation temperature control 42 to open the bypass valve 48 initially. At the other extreme, an initially small temperature differential such as 0.5 to 1.0° C. might cause the temperature control 42 to keep the bypass valve 48 closed. As the temperature control 42 may be embodied in a temperature control computer, a large number of different operating sequences may be programmed into the computer, and the appropriate sequence selected for the particular situation presenting itself.

Figure 6:
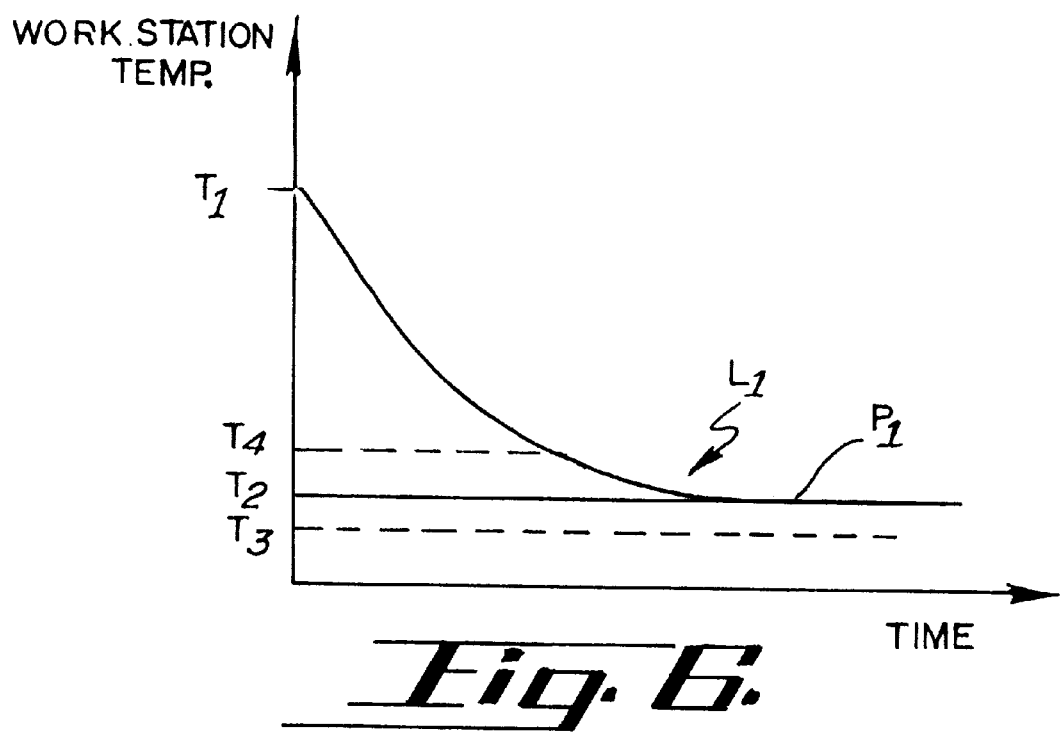
FIG. 6 is a graph of one possible time sequence for controlling a workstation's temperature.

For example, FIG. 6 is a graph of workstation temperature versus time. The workstation is to be cooled from an initial temperature $T_1$, for example 22° C. to a desired temperature $T_2$ perhaps 20° C. somewhat above the temperature of the fluid coolant $T_3$, such as 190C. In this example the workstation temperature control 42 might initially close the bypass valve 48, and turn off the heater 36. When the workstation temperature falls to a predetermined value $T_4$ the workstation temperature control 42, as set by the operator, signals the heater 36 to begin supplying heat to the flow line 26. The temperature of the workstation 28 then decreases less rapidly as depicted by the graph line $L_1$, until the temperature of the workstation 28 reaches the desired temperature $T_2$, as depicted at point $P_1$. The workstation temperature control 42 then precisely modulates the heater 36 in order to maintain the temperature of the workstation 28 at the desired temperature $T_2$.

Figure 7:
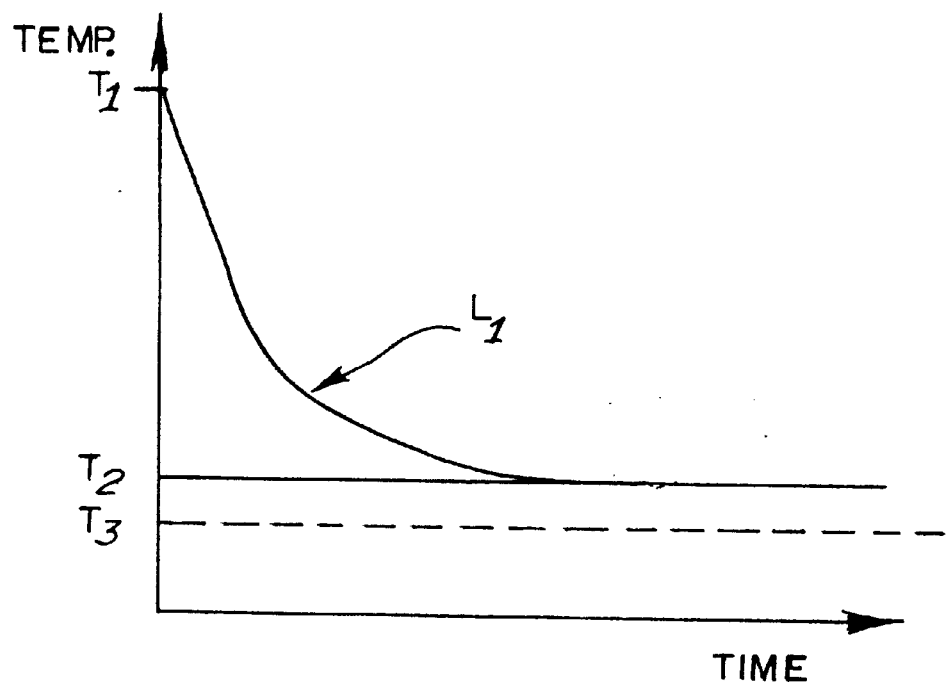
FIG. 7 is a graph of a second possible time sequence for controlling a workstation's temperature.

FIG. 7 shows a second example. Here the workstation, starts out at a higher temperature $T_1$, perhaps 25° C. The workstation temperature control 42 opens the bypass valve 48 providing rapid cooling of the workstation 28 as depicted by the chart line $L_1$. As the workstation temperature approaches desired temperature $T_2$, perhaps 20° C., somewhat above the temperature of the fluid coolant $T_3$, such as 19° C., the workstation temperature control 42 closes the bypass valve 48, thus shutting off the high-rate flow of unheated coolant. The workstation temperature control 42 then precisely modulates the heater 36 to maintain the temperature of the workstation 28 at temperature $T_2$.

A plurality of workstations 28, 28.1, 28.2 may be regulated by the invention through flow lines 26, 26.1, 26.2, heaters 36, 36.1, 36.2, flow regulators 34, 34.1, 34.2, bypass valves 48, 48.1, 4.2, workstation temperature sensors 40, 40.1, 40.2 and workstation temperature controls 42, 42.1, 42.2. Having one temperature control regulate a number of workstations can result in cost savings. At the same time, replicating the workstation temperature and flow controls allows each workstation to be independently controlled to an independent predetermined temperature, if so desired.

Figure 2:
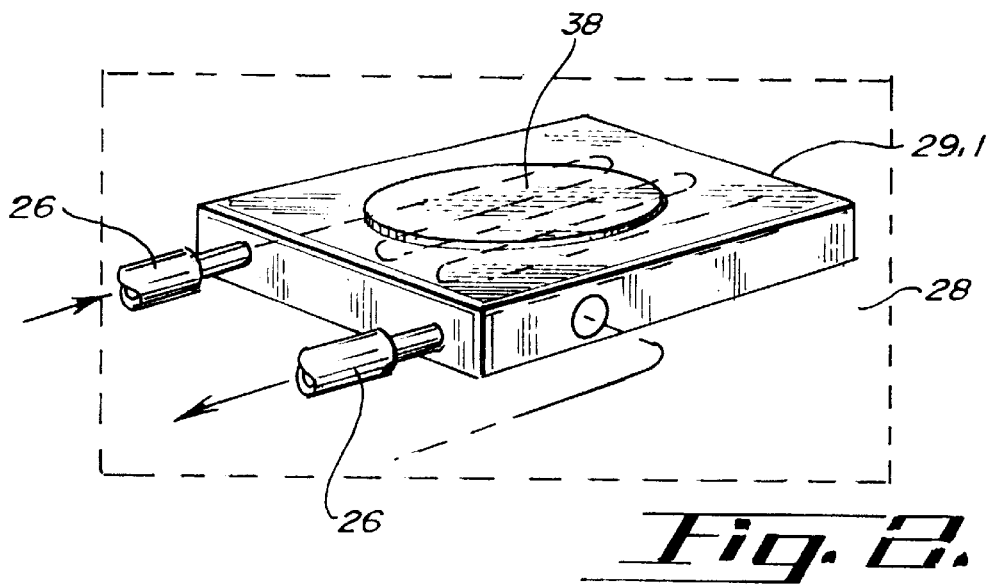
FIG. 2 is a perspective view of one possible work station whose temperature is being controlled.

A first embodiment of a workstation is shown in FIG. 2, where the workstation 28 comprises a chill plate through which the fluid coolant is circulated from the flow line 26. The chill plate has an upper surface 29.1 upon which the workpiece 38 rests. In this embodiment the workpiece may be a semiconductor wafer whose temperature is to be controlled.

Figure 3:
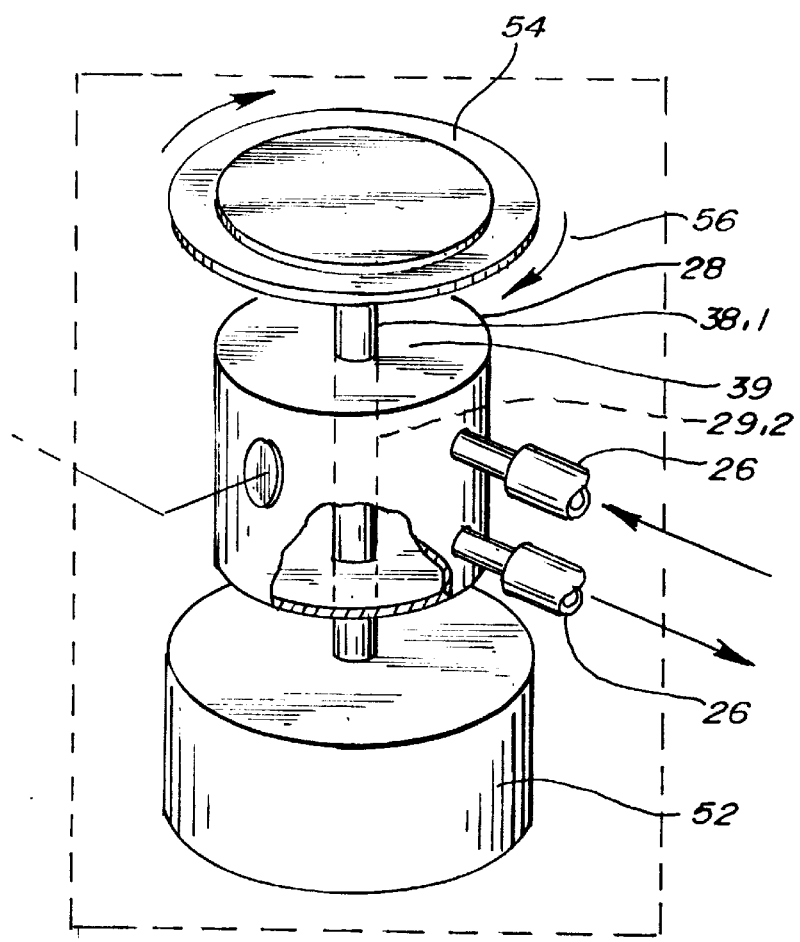
FIG. 3 is a perspective view of a second possible work station whose temperature is being controlled.

A second embodiment of a workstation is shown in FIG. 3, where the workstation 28 comprises a cylindrical collar with an interior cylindrical passage 29.2 through which the work medium 38.1 extends. In this embodiment, the work medium 38.1 may be the shaft 39 of an electric motor 52. The fluid coolant circulates from the flow line 26 in and out of the workstation 28. The workstation 28 thereby regulates the temperature of the shaft 39, thus preventing heat from the motor 52 from reaching the workpiece 54, which can be a wafer supported on a rotating chuck 56 on the end of the shaft 39.

Figure 4:
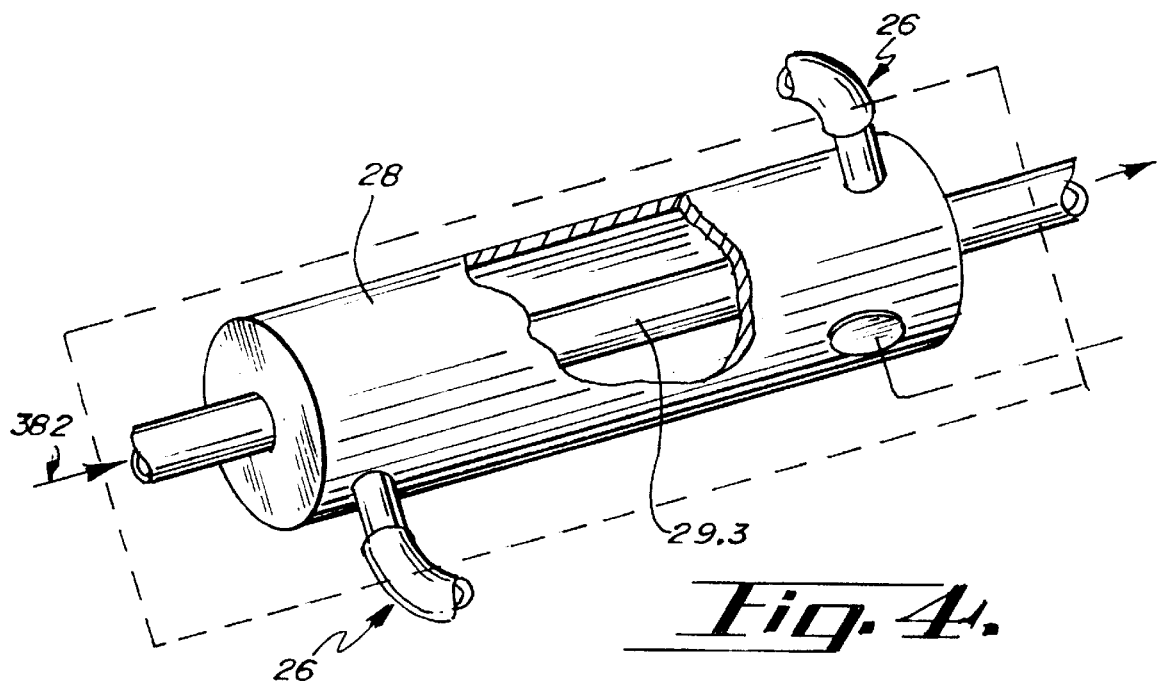
FIG. 4 is a perspective view of a third possible work station whose temperature is being controlled.

A third embodiment of a workstation is shown in FIG. 4, where the workstation 28 comprises a liquid-to-liquid heat exchanger with an interior pipe 29.3 through which a liquid work medium to be cooled 38.2 is flowing. The fluid coolant circulates from the flow line 26 in and out of the workstation 28, thereby regulating the temperature of the liquid work medium 38.2.

Figure 5:
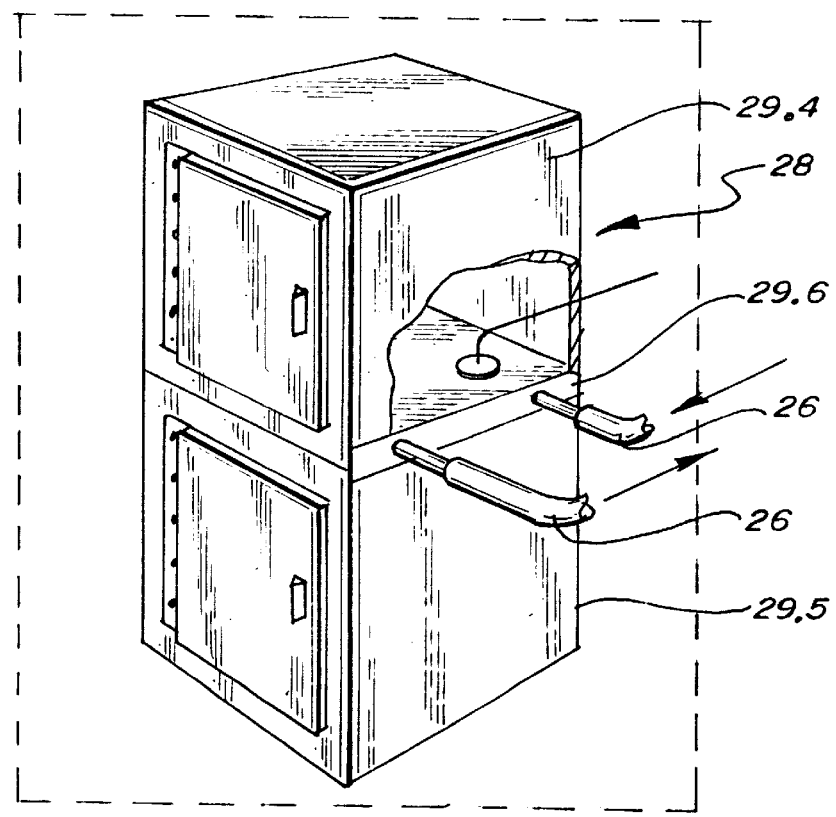
FIG. 5 is a perspective view of a fourth possible work station whose temperature is being controlled.

A fourth embodiment of a workstation is shown in FIG. 5, where the workstation 28 comprises a module with an upper compartment 29.4 and lower compartment 29.5 separated by a cooling plate 29.6. The fluid coolant circulates from the flow line 26 in and out of the cooling plate 29.6, thereby preventing thermal interactions between processes in the upper compartment 29.4 and the lower compartment 29.5.

It will be seen that a temperature control with recirculated coolant and a rapid transient response has been described. A process for precisely cooling a work medium to a predetermined temperature has also been described.

The present invention may be embodied in other specific forms without departing from the spirit or essential attributes thereof; therefore, the illustrated embodiment should be considered in all respects as illustrative and not restrictive, reference being made to the appended claims rather than to the foregoing description to indicate the scope of the invention.

What is claimed:

1. A temperature control for adjusting the temperature of a workstation and a work medium at a workstation to a predetermined temperature, comprising:

a source of fluid coolant, a cooling vehicle, main coolant temperature sensor and main coolant temperature control for detecting and maintaining the temperature of the fluid coolant at a temperature below said predetermined temperature, a flow line, a return line, and a recirculating pump for receiving fluid coolant from said source of fluid coolant and providing fluid coolant to the workstation and producing cooling of the workstation and work medium therein, a workstation temperature sensor and workstation temperature control for detecting and regulating the temperature of the workstation, a coolant heater in said flow line responsive to said workstation temperature control for heating the coolant being supplied to the workstation to a temperature nearly equal to said predetermined temperature as to maintain the workstation and work medium at said predetermined temperature, said workstation temperature control reducing the heating by said heater while a substantial differential exists between the workstation temperature and said predetermined temperature, and said workstation temperature control increasing the heating by said heater as said differential decreases and as the workstation temperature nearly achieves said predetermined temperature, a flow regulator in said flow line for maintaining the desired rate of flow of coolant through said flow line, and a bypass valve for bypassing both said heater and said flow regulator, thereby providing a flow of unwarmed coolant to the workstation at an increased rate of flow, said bypass valve being responsive to said workstation temperature control.

2. A temperature control as in claim 1, wherein said main coolant temperature control and said workstation temperature control are a temperature control computer.

3. A temperature control as in claim 1, wherein said temperature control controls the temperature of a plurality of workstations and work media therein.

4. A workstation with a temperature control for adjusting the temperature of the workstation and a work medium at the workstation to a predetermined temperature, comprising:

a workstation, a source of fluid coolant, a cooling vehicle, main coolant temperature sensor and main coolant temperature control for detecting and maintaining the temperature of the fluid coolant at a temperature below said predetermined temperature, a flow line, a return line, and a recirculating pump for receiving fluid coolant from said source of fluid coolant and providing fluid coolant to the workstation and producing cooling of the workstation and work medium therein, a workstation temperature sensor and workstation temperature control for detecting and regulating the temperature of the workstation, a coolant heater in said flow line responsive to said workstation temperature control for heating the coolant being supplied to the workstation to a temperature nearly equal to said predetermined temperature as to maintain the workstation and work medium at said predetermined temperature, said workstation temperature control reducing the heating by said heater while a substantial differential exists between the workstation temperature and said predetermined temperature, and said workstation temperature control increasing the heating by said heater as said differential decreases and as the workstation temperature nearly achieves said predetermined temperature, a flow regulator in said flow line for maintaining the desired rate of flow of coolant through said flow line, and a bypass valve for bypassing both said heater and said flow regulator, thereby providing a flow of unwarmed coolant to the workstation at an increased rate of flow, said bypass valve being responsive to said workstation temperature control.

5. A temperature control as in claim 4, wherein said workstation comprises a cooling plate for supporting a wafer whose temperature is to be regulated.

6. A temperature control as in claim 4, wherein said workstation comprises a cylindrical collar encompassing a shaft to be cooled, said shaft being connected to an electric motor at one end, and said shaft having a chuck at the end of said shaft distal from said motor, said chuck supporting a wafer whose temperature is to be regulated.

7. A temperature control as in claim 4, wherein said workstation comprises a liquid-to-liquid heat exchanger for regulating the temperature of a fluid passing through said heat exchanger.

8. A temperature control as in claim 4, wherein said workstation comprises a module having an upper compartment, a lower compartment, and a cooling plate separating said upper compartment from said lower compartment, said module regulating the temperature of materials in said upper compartment and said lower compartment.

9. A temperature control as in claim 4, wherein said main coolant temperature control and said workstation temperature control are a temperature control computer.

10. A temperature control as in claim 4, wherein said temperature control controls the temperature of a plurality of workstations and work media therein.

* * * * *